(12) United States Patent
Rogers et al.

(10) Patent No.: US 9,217,201 B2
(45) Date of Patent: Dec. 22, 2015

(54) METHODS FOR FORMING LAYERS ON SEMICONDUCTOR SUBSTRATES

(71) Applicant: APPLIED MATERIALS, INC., Santa Clara, CA (US)

(72) Inventors: Matthew S. Rogers, San Jose, CA (US); Kevin Bautista, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/204,819

(22) Filed: Mar. 11, 2014

(65) Prior Publication Data

US 2014/0273518 A1   Sep. 18, 2014

Related U.S. Application Data

(60) Provisional application No. 61/790,643, filed on Mar. 15, 2013.

(51) Int. Cl.

| | |
|---|---|
| *H01L 21/02* | (2006.01) |
| *C23C 16/52* | (2006.01) |
| *C23C 16/455* | (2006.01) |
| *C23C 16/458* | (2006.01) |
| *H01L 21/321* | (2006.01) |

(52) U.S. Cl.
CPC ............ *C23C 16/52* (2013.01); *C23C 16/4584* (2013.01); *C23C 16/45502* (2013.01); *H01L 21/02057* (2013.01); *H01L 21/02247* (2013.01); *H01L 21/02252* (2013.01); *H01L 21/3211* (2013.01)

(58) Field of Classification Search
None
See application file for complete search history.

(56) References Cited

U.S. PATENT DOCUMENTS

| | | | |
|---|---|---|---|
| 6,450,116 B1 * | 9/2002 | Noble et al. | 118/723 R |
| 6,867,149 B2 * | 3/2005 | Bajt et al. | 438/763 |
| 8,372,761 B2 * | 2/2013 | Kabe et al. | 438/770 |
| 8,957,519 B2 * | 2/2015 | Yang et al. | 257/753 |
| 2006/0228496 A1 * | 10/2006 | Choi et al. | 427/569 |
| 2010/0159156 A1 * | 6/2010 | Mamiya et al. | 427/569 |
| 2010/0173493 A1 * | 7/2010 | Kushibiki et al. | 438/694 |
| 2012/0098133 A1 * | 4/2012 | Yang et al. | 257/753 |
| 2013/0034668 A1 * | 2/2013 | Sagisaka et al. | 427/569 |
| 2013/0040444 A1 | 2/2013 | Rogers et al. | |
| 2013/0164942 A1 * | 6/2013 | Kato et al. | 438/758 |
| 2014/0290576 A1 * | 10/2014 | Chen et al. | 118/708 |
| 2014/0349032 A1 * | 11/2014 | Kato et al. | 427/569 |

* cited by examiner

*Primary Examiner* — Alexander Ghyka
(74) *Attorney, Agent, or Firm* — Moser Taboada; Alan Taboada

(57) ABSTRACT

Methods of forming a layer on a substrate may include providing a substrate to a process chamber, the process chamber having a gas port, an exhaust, and a plasma port disposed between the gas port and the exhaust; providing a process gas from the gas port in a first direction such that the process gas flows across the substrate; providing a plasma such that a flow of the plasma interacts with a flow of the process gas at an angle that is non-perpendicular; and rotating the substrate while providing the process gas and the plasma, wherein a thickness profile of the layer is controlled by adjusting at least one of a flow velocity of the process gas, a flow velocity of the plasma, the angle the flow of the plasma interacts with the flow of the process gas, or a direction of rotation of the substrate.

20 Claims, 6 Drawing Sheets

METHODS FOR FORMING LAYERS ON SEMICONDUCTOR SUBSTRATES

CROSS-REFERENCE TO RELATED APPLICATIONS

This application claims benefit of U.S. provisional patent application Ser. No. 61/790,643, filed Mar. 15, 2013, which is herein incorporated by reference.

FIELD

Embodiments of the present invention generally relate to semiconductor substrate processing.

BACKGROUND

Substrate processing using excited species to promote reactions has been a staple of the semiconductor industry for many years. However, with the transition from planar features to 3D features comes a new challenge, conformality. The inventors have observed that conformal processing of high aspect ratio features requires non directional species, which makes direct plasmas with charged species a poor solution. Thus, the inventors believe that radical and excited neutral gas sources will be required to continue processes thermally incompatible materials while also enabling the 3D transition to occur. However, because most radical sources are remote, and therefore removed from the processing regime, and because excited species generally have shorter lifetimes then more stable gas species, techniques for uniform delivery or to create a tunable film thickness across the substrate.

Therefore, the inventors have provided improved methods for forming layers atop a substrate.

SUMMARY

Methods for forming layers on semiconductor substrates are provided herein. In some embodiments, a method of forming a layer on a substrate includes providing a substrate to a substrate support in a process chamber, the process chamber having a gas port disposed on a first side of the substrate support, an exhaust disposed on a second side of the substrate support opposite the first side, and a plasma port disposed between the gas port and the exhaust; providing a process gas from the gas port in a first direction such that the process gas flows across a surface of the substrate from the gas port to the exhaust; providing a plasma from the plasma port to the substrate in a second direction that is different from the first direction to form a layer, wherein the plasma is provided such that a flow of the plasma interacts with a flow of the process gas at an angle that is non-perpendicular; and rotating the substrate in a first direction while providing the process gas and the plasma, wherein a thickness profile of the layer is controlled by adjusting at least one of a flow velocity of the process gas, a flow velocity of the plasma, the angle the flow of the plasma interacts with the flow of the process gas, or a direction of rotation of the substrate.

In some embodiments, a method of forming a layer on a substrate includes: providing a substrate to a substrate support in a process chamber, the process chamber having a gas port disposed on a first side of the substrate support, an exhaust disposed on a second side of the substrate support opposite the first side, and a plasma port disposed between the gas port and the exhaust; providing a process gas from the gas port in a first direction such that the process gas flows across a surface of the substrate from the gas port to the exhaust, wherein the process gas comprises a nitrogen containing gas; providing a plasma formed from a nitrogen containing gas from the plasma port to the substrate in a second direction that is different from the first direction to form a nitrogen containing layer, wherein the plasma is provided such that a flow of the plasma interacts with a flow of the process gas at an angle of about 56 to about 71 degrees; and rotating the substrate in a first direction while providing the process gas and the plasma, wherein a thickness profile of the nitrogen containing layer is controlled by adjusting at least one of a flow velocity of the process gas, a flow velocity of the plasma, the angle the flow of the plasma interacts with the flow of the process gas, or a direction of rotation of the substrate.

In some embodiments, a computer readable medium is provided having instructions stored thereon that, when executed, cause a method to be performed for forming a layer on a substrate disposed on a substrate support in a process chamber having a gas port disposed on a first side of the substrate support, an exhaust disposed on a second side of the substrate support opposite the first side, and a plasma port disposed between the gas port and the exhaust. The method may include any of the embodiments disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
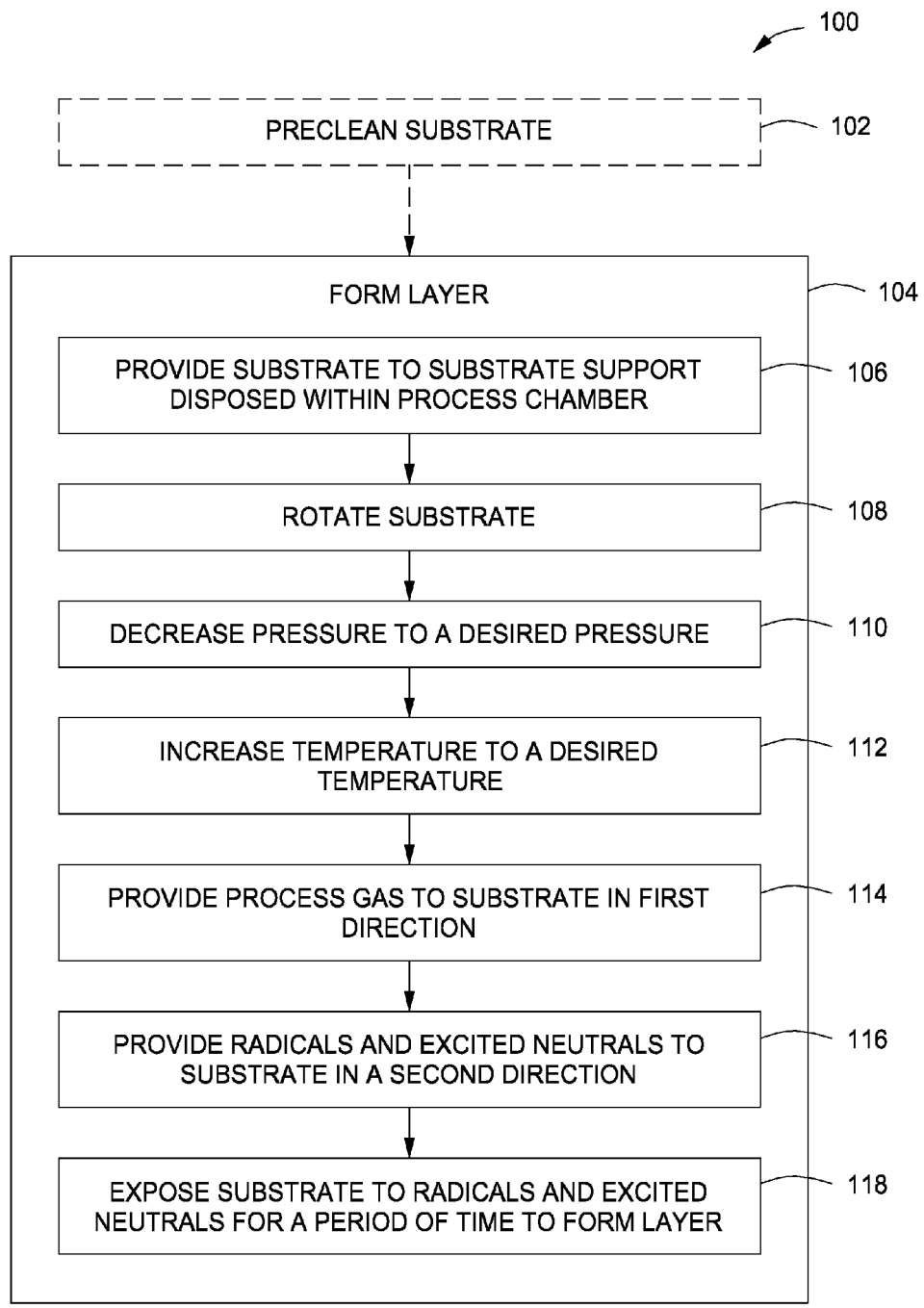
FIG. 1 depicts a method of forming a layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for forming a layer atop a substrate are provided herein. In at least some embodiments, the inventive method may advantageously provide a method that allows for control over a thickness and uniformity of a layer across a substrate (e.g., the thickness profile of the layer) by utilizing a number of "tuning knobs", for example, such as a rotational speed and direction of the substrate, a velocity, pressure and mass flow of a process gas and a plasma and an angle of interaction between a flow of the process gas and a flow of the plasma.

FIG. 1 is a flow diagram of a method 100 for forming a layer atop a substrate in accordance with some embodiments of the present invention. FIGS. 2A-B and 3A-B are illustrative cross-sectional views of a substrate during different stages of the processing sequence of FIG. 1 in accordance with some embodiments of the present invention. The inventive methods may be performed in any apparatus suitable for processing semiconductor substrates in accordance with embodiments of the present invention, such as the apparatus discussed below with respect to FIGS. 4 through 6B.

Referring to FIG. 1, the method generally begins at 104, where a layer is formed atop a substrate. To form the layer at 104, first, at 106, a substrate is provided to a substrate support disposed within a process chamber. The process chamber may be any process chamber suitable to perform the below method, for example, such as the process chamber described below with respect to FIG. 4.

The substrate may be any type of substrate suitable for semiconductor device fabrication. For example, referring to FIGS. 2A-B, the substrate 202 may be a silicon substrate, for example crystalline silicon (e.g., Si<100> or Si<111>), silicon oxide, strained silicon, doped or undoped polysilicon, or the like, a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, the substrate 202 may comprise a partially or fully fabricated semiconductor device, for example such as a two dimensional (2D) or three dimensional (3D) device, such as a multigate device, fin field effect transistor (FinFET), metal oxide semiconductor field effect transistor (MOSFET), nanowire field effect transistor (NWFET), tri-gate transistor, a memory device such as a NAND device or NOR device, or the like. A 3-dimensional (or 3D) device refers to a semiconductor device where the transistor forms conducting channels on three sides of a vertical structure, as compared to a traditional 2D planar transistor which forms a conducting channel mainly under the gate.

Figure 2A:
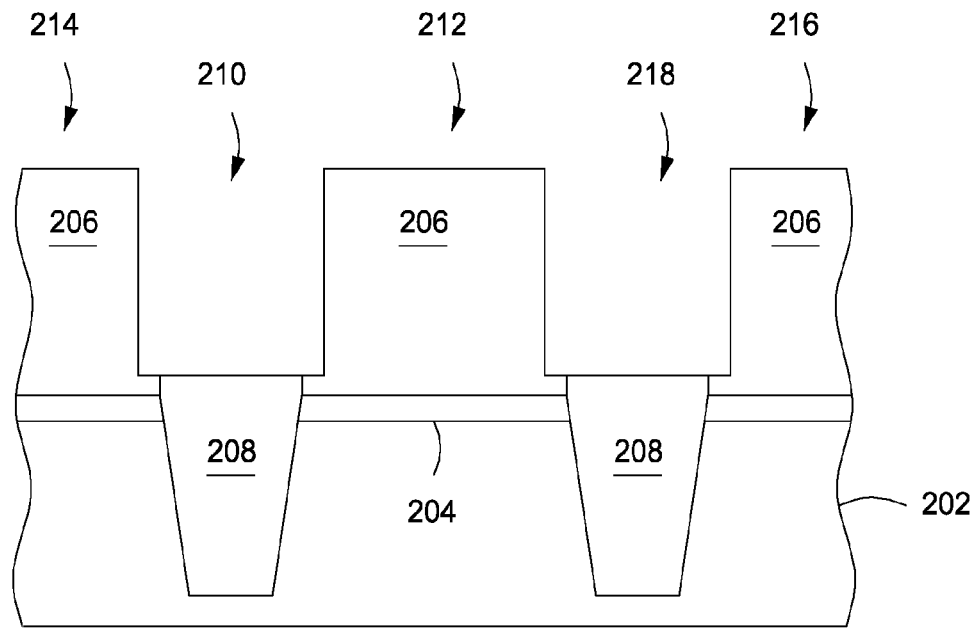
FIGS. 2A-B are illustrative cross-sectional views of a substrate during different stages of the processing sequence of FIG. 1 in accordance with some embodiments of the present invention.
Figure 2B:
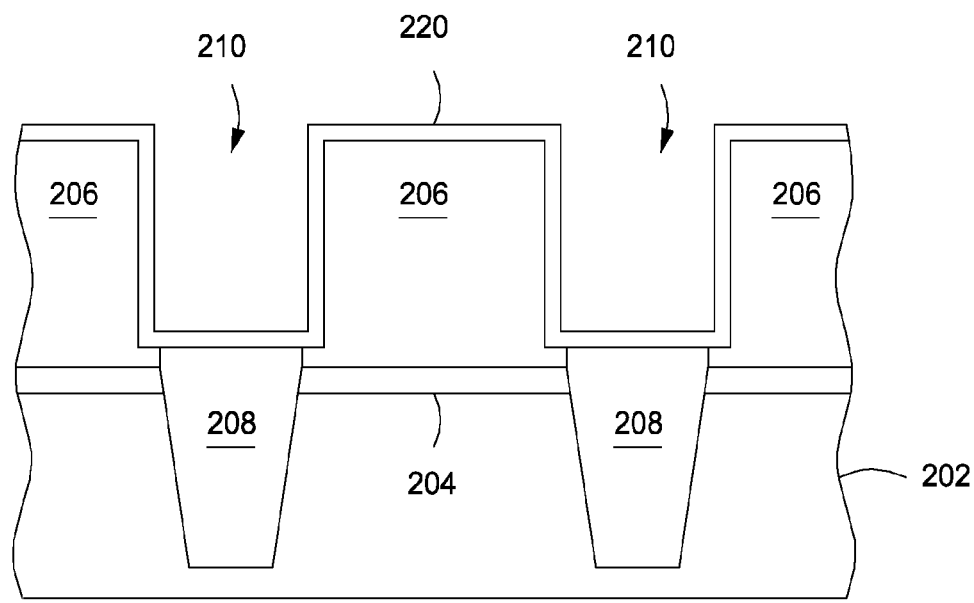

In some embodiments, the substrate 202 includes one or more layers, for example, a tunnel oxide layer 204, such as shown in FIGS. 2A-B. The tunnel oxide layer 204 may comprise any materials suitable for the fabrication of a desired semiconductor device. For example, in some embodiments, the tunnel oxide layer 204 may include silicon and oxygen, such as silicon oxide ($SiO_2$), silicon oxynitride (SiON), or high-k dielectric materials, such as aluminum (Al), hafnium (Hf), lanthanum (La), zirconium (Zr) based oxides or oxynitrides, or silicon nitrides ($Si_xN_y$), in single or layered structures, or the like.

In some embodiments, the substrate 202 may include a plurality of field isolation regions 208 formed in the substrate 202 to isolate wells having different conductivity types (e.g., n-type or p-type) and/or to isolate adjacent transistors (not shown). The field isolation regions 208 may be shallow trench isolation (STI) structures formed, for example, by etching a trench into the substrate 202 and then filling the trench with a suitable insulator, such as silicon oxide ($SiO_2$), silicon oxynitride (SiON), or the like.

In some embodiments, for example where the substrate 202 comprises a partially fabricated memory device, a floating gate layer 206 may be disposed atop the substrate 202 and/or tunnel oxide layer 204. The floating gate layer may comprise any conductive material suitable to form a desired device, for example, silicon, polysilicon, metals, or the like. The floating gate layer 206, tunnel oxide layer 204, and the underlying portion of the substrate 202 form a cell 212 (or memory unit) of the memory device. In some embodiments, the cell 212 may be separated from adjacent cells (e.g., cell 214 and cell 216) by features 210, 218 formed in the floating gate layer 206. The features 210, 218 may be any type of features, for example such as trenches, vias, or shallow trench isolation (STI) regions.

At 108, the substrate 202 is rotated. The substrate 202 may be rotated via any suitable mechanism, for example, such as the support ring 462 and rotatable cylinder 463 configuration described below with respect to FIG. 4. By rotating the substrate 202, a distribution, length of time and incidence of contact between the substrate 202 and the process gases and/or plasma provided to the process chamber (as described below) may be controlled. Thus, a thickness proximate an edge and center of the layer to be formed atop the substrate 202 may be controlled at least in part by the direction and/or speed at which the substrate 202 is rotated.

Figure 5:
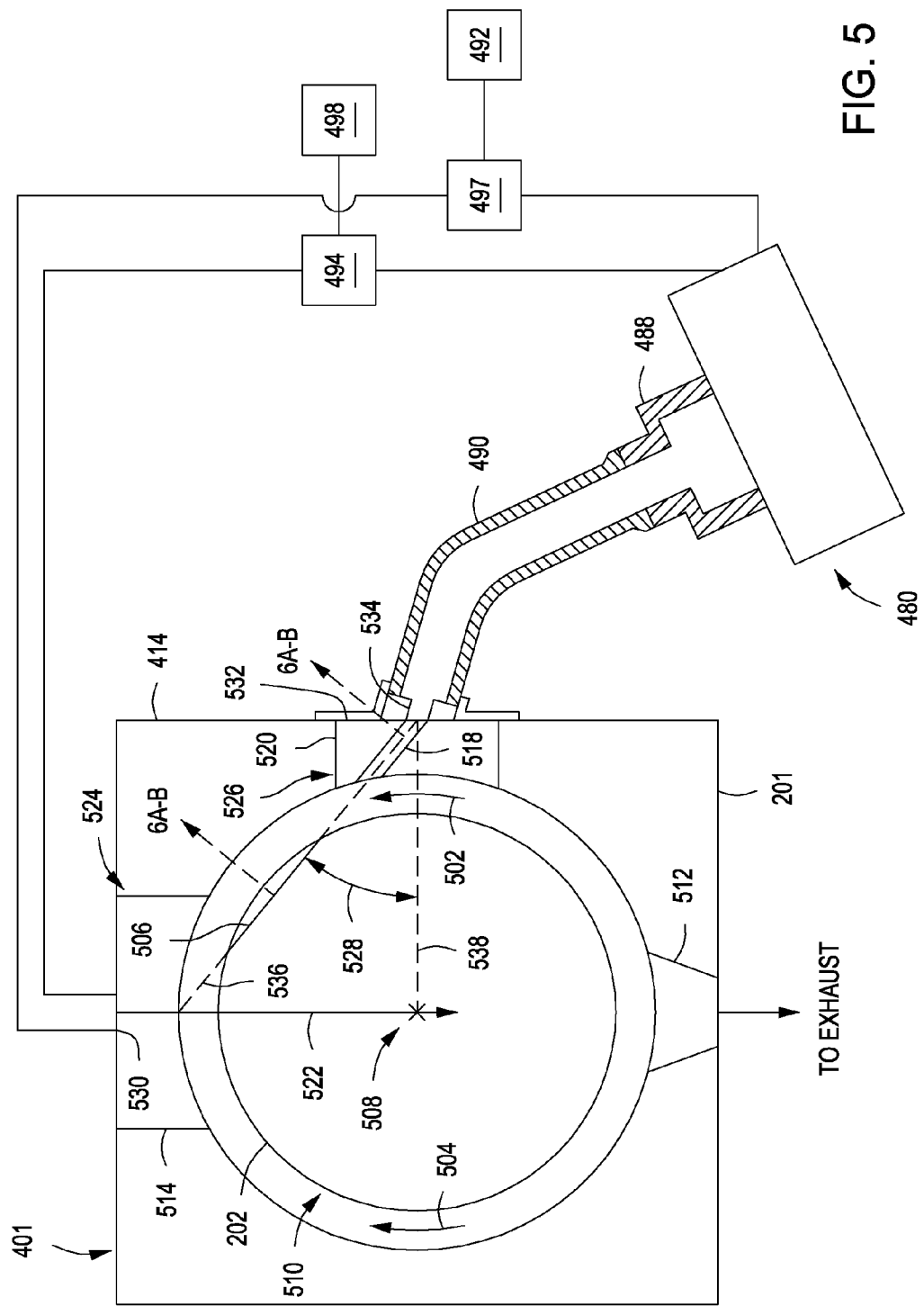
FIG. 5 depicts a portion of a processing system suitable for performing the method depicted in FIG. 1 in accordance with some embodiments of the present invention.

Generally, where a gas source is provided at an angle to an exhaust of the process chamber, the substrate may be rotated toward the gas source and away from the exhaust (clockwise as shown in FIG. 5), or away from the gas source and toward the exhaust (counter-clockwise as shown in FIG. 5). For example, referring to FIG. 5, in some embodiments, the substrate 202 may be rotated in a counter-clockwise direction 502 (as viewed from above the substrate 202). In such embodiments, the substrate 202 may be rotated in the counter-clockwise direction 502 at a speed up to about 240 rotations per minute. Such counter-clockwise rotation of the substrate 202 may cause a flow of radicals and excited neutrals (indicated by arrow 506) to be dispersed proximate a center 508 of the substrate 202, thereby increasing a thickness of the layer proximate a center 508 of the substrate 202.

Alternatively, in some embodiments, the substrate may be rotated in a clockwise direction 504 (as viewed from above the substrate 202). In such embodiments, the substrate 202 may be rotated in the clockwise direction 504 at a speed of about up to about 240 rotations per minute. Such clockwise rotation may cause the flow of radicals and excited neutrals to be directed towards an exhaust 512, causing the radicals and excited neutrals to contact the substrate 202 at an edge 510 of the substrate 202 at a greater rate as compared to proximate the center 508 of the substrate, thereby increasing a thickness of the layer proximate the edge 510 of the substrate 202. Faster rotation speeds are typically related to better film uniformity. In some embodiments, the rotation direction matters in that it either helps mix the gases more, or distribute the gases to different areas of the substrate, which can increase residence time for species in the chamber thus leading to increased film thickness.

Referring back to FIG. 1, at 110, a pressure within the process chamber is decreased to a desired pressure. The desired pressure may be any pressure suitable to deposit the layer having desired characteristics (e.g., thickness, crystalline composition, or the like). For example, in some embodiments, the pressure in the process chamber may be decreased to about 1 Torr to about 20 Torr, or in some embodiments, about 5 Torr. In some embodiments, the pressure may be adjusted to control a thickness and uniformity of the layer across the substrate 202. For example, in some embodiments, as the pressure is increased, a dispersion of the plasma provided (as described below) may be decreased, thereby providing a localized increase in thickness of the layer.

At 112, a temperature within the process chamber is increased to a desired temperature. The temperature may be any temperature suitable to deposit the layer having desired characteristics (e.g., thickness, crystalline composition, or the like). For example, in some embodiments, the temperature in the process chamber may be increased to about 850 degrees Celsius to about 1150 degrees Celsius, or in some embodiments, about 1000 degrees Celsius. In some embodiments, the temperature within the process chamber may be gradually increased (e.g., "ramped") to the desired temperature. In such embodiments, the temperature within the process chamber may be increased to the desired temperature at a rate of up to about 220 degrees Celsius per minute. Temperature increases can generally be performed in one of two modes. Open loop tuning (OLT), based on an empirically derived algorithm, and closed loop tuning, which is a linear increase. OLT is typically used at low temperatures (below ability for pyrometry to capture accurate temperature). The OLT helps to warm-up the substrate and prevents the substrate from bowing, popping, or other issues like substrate movement. The second mode of temperature increase is called closed loop tuning which uses a linear increase based on a closed loop feedback routine. The ramp rate range for the closed loop control is about 0-220 degrees Celsius/sec. For example, typical soak recipes can ramp at about 75 degrees Celsius/sec, and spike recipes can ramp as high as about 220 degrees Celsius/sec. These ramp rates can vary depending upon the particular application.

At 114, a process gas is provided to the substrate 202 in a first direction. The process gas may be any process gas suitable to form the layer having a desired composition. For example, in embodiments where the layer is a nitrogen containing layer, the process gas may comprise a nitrogen containing gas, for example, such as a nitrogen gas ($N_2$), ammonia ($NH_3$), nitric oxide (NO), nitrous oxide ($N_2O$), or the like. The process gas may be provided at any suitable flow rate, for example, about 1 to about 5 slm. In some embodiments, the flow rate may be adjusted to control a thickness and/or uniformity of the layer.

The first direction may be any direction suitable to expose the substrate 202 to a sufficient amount of process gas to facilitate forming the layer. For example, referring to FIG. 5, in some embodiments, the process gas may be provided in a laminar flow across the substrate 202 from a first side of the substrate 202 to a second, opposing side of the substrate 202 (flow of process gas indicated by arrow 522).

At 116, radicals and excited neutrals are provided to the substrate in a second direction. The radicals and excited neutrals may be formed from any process gas suitable to form the layer having a desired composition. For example, in embodiments where the layer is a nitrogen containing layer, the plasma may be formed from a nitrogen containing gas, for example, such as nitrogen gas ($N_2$), ammonia ($NH_3$), nitric oxide (NO), nitrous oxide ($N_2O$). The radicals and excited neutrals may be provided at any suitable flow rate, for example, about 1 to about 5 slm. In some embodiments, the flow rate may be adjusted to control a thickness and/or uniformity of the layer. In some embodiments, the flow rate and/or velocity (e.g., determined by a combination of a flow rate and a diameter and an inlet/conduit utilized to proved each of the process gas and plasma) of each of the process gas (described above) and the radicals and excited neutrals may be independently adjusted to control an interaction of the process gas and the radicals and excited neutrals. By controlling an interaction of the process gas and the radicals and excited neutrals, a concentration and dispersion of each of the process gas and the radicals and excited neutrals across the substrate may be controlled, thereby controlling a thickness of the layer formed.

In some embodiments, the radicals and excited neutrals are formed in a chamber that is separate from the process chamber (e.g., a remote plasma source 480 such as shown in FIG. 5) and subsequently provided to the process chamber. Referring to FIG. 5, in some embodiments, the radicals and excited neutrals may be provided to the process chamber 401 such that a direction of flow of the radicals and excited neutrals (the second direction, indicated by arrow 506) is generally toward a gas inlet 530/slit valve 514 that provides the process gas provided at 114. The inventors have observed that providing the flow of the radicals and excited neutrals toward the gas inlet 530 creates an interaction between the flow of the process gas (arrow 522) and the flow of the radicals and excited neutrals (arrow 506) that may facilitate a more uniform delivery of radicals and excited neutrals to the substrate 202 as compared to, for example, providing the radicals and excited neutrals in a direction perpendicular to the flow of process gas or toward an exhaust 512 of the process chamber 401.

In some embodiments, an angle 528 of the flow of the radicals and excited neutrals (arrow 506) as measured from perpendicular to the flow of process gas (arrow 522), as indicated by dashed line 538, may be adjusted to control a thickness and uniformity of the layer across the substrate (e.g., zero degrees is perpendicular to 522 and 90 degrees is parallel to 522 and in the opposite direction). For example, as the angle 528 increases, an incidence of contact between the radicals and excited neutrals and an area proximate an edge 510 of the substrate 202 may increase, thereby increasing the thickness of the layer proximate the edge 510 of the substrate 202. Alternatively, as the angle 528 decreases, an incidence of contact between the radicals and excited neutrals and an area proximate the center 508 of the substrate 202 may increase, thereby increasing the thickness of the layer proximate the center 508 of the substrate 202. For example, in some embodiments, the radicals and excited neutrals may be provided such that the angle 528 of the flow of radicals and excited neutrals (arrow 506) relative to the flow of process gas (arrow 522) may be about −60 to about 60 degrees, where zero degrees is perpendicular to the flow of process gas (arrow 522).

In addition, in some embodiments, a direction of flow of the radicals and excited neutrals with respect to a top surface of the substrate may be adjusted to control a thickness and uniformity of the layer across the substrate. For example, referring to FIG. 6A, in some embodiments, the flow of radicals and excited neutrals (arrow 506) may be directed such that the flow is substantially parallel with the top surface 602 of the substrate 202. However, referring to FIG. 6B, an angle 604 between the flow of radicals and excited neutrals (arrow 506) and the top surface 602 of the substrate 202 may be decreased such that the flow of radicals and excited neutrals (arrow 506) is directed towards a center 508 or an edge 510 of the substrate 202, thereby adjusting the thickness of the layer proximate the center 508 of edge 510 of the substrate 202. For example, in some embodiments, the plasma may be provided such that the angle 604 between the flow of plasma (e.g., radicals and excited neutrals, arrow 506) and the top surface 602 of the substrate 202 may be about −10 to about 10 degrees, where zero degree is substantially parallel to the top surface 602 of the substrate 202.

Although described as sequential portions of the method 100, increasing the temperature of the process chamber at 112, providing the process gas at 114 and providing the plasma at 116 may be done simultaneously or at least partially overlapping. For example, in some embodiments, as the temperature of the process chamber is increased to the desired temperature, the process gas and radicals and excited neutrals may be provided simultaneously, sequentially, or in alternating intervals. In some embodiments, the provision of the process gas and/or radicals and excited neutrals may begin when the temperature reaches a predetermined temperature during a gradual temperature increase to the desired temperature.

Next, at 118, the substrate 202 is exposed to the radicals and excited neutrals for a period of time (e.g., a "soak" period) to form the layer 220, such as shown in FIG. 2A. In some embodiments, exposing the substrate 202 to the radicals and excited neutrals, for example, the nitrogen containing radicals and excited neutrals as described above, causes a nitridation of the surfaces of the substrate 202 and/or layers disposed atop the substrate (e.g., the floating gate layer 206), thereby forming a layer 220 containing nitrogen. In such embodiments, the layer 220 may comprise any nitrogen containing materials suitable to fabricate a desired semiconductor device. For example, in some embodiments, the layer 220 may comprise silicon nitride (SiN), silicon oxynitride (SiON), or the like.

The period of time may be any amount of time suitable to form the layer 220 to a desired thickness. For example, in some embodiments, the substrate 202 may be exposed to the radicals and excited neutrals for about 30 to about 90 seconds. The layer 220 may be formed to any thickness suitable to form the desired semiconductor device. For example, in some embodiments, the layer 220 may be formed to a thickness of about 10 to about 30 angstroms.

After the layer 220 is formed at 118, the method generally ends and the substrate 202 may proceed for further processing. For example, subsequent processes such as deposition, etch, anneal, activation processes, or the like, may be performed to continue fabrication of a semiconductor device. In some embodiments, following the formation of the layer at 118, the flow of process gas and radicals and excited neutrals may be stopped and the process chamber cooled to allow the removal of the substrate from the process chamber. Immediately prior to removal, a purge gas (e.g., a nitrogen containing gas such as nitrogen gas ($N_2$)) may be provided to the process chamber to remove contaminants or residual gases and/or materials from the process chamber prior to removing the substrate from the process chamber.

In some embodiments, prior to forming the layer atop the substrate at 104, a preclean process may optionally be performed (shown at 102). The preclean process may remove impurities from the substrate and condition the surfaces of the substrate and/or layers formed atop the substrate (e.g., gate layer 206) to facilitate adhesion of the layer to be formed atop the substrate. For example, referring to FIG. 3A, in some embodiments, a layer 302 to be removed from the substrate 202 may be disposed atop the substrate 202 and/or layers (e.g., gate layer 206) of the substrate 202. Although described herein as a layer, the layer 302 to be removed may also be a partial layer, or may be islands of material disposed only upon portions of the substrate 202. The layer 302 may comprise any materials that are to be removed from the substrate 202, for example, native oxide layers, nitride layers, dielectric layers, silicon layers or the like, or prior process residues or contaminants, for example, such as carbon, silicon, nitrogen or oxygen containing contaminants, or the like.

Figure 3A:
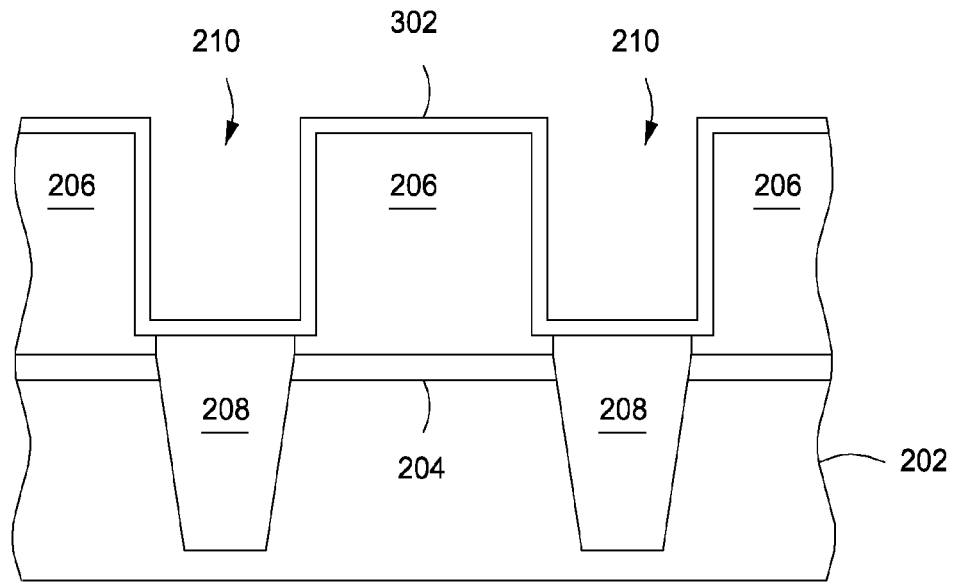
FIGS. 3A-B are illustrative cross-sectional views of a substrate during different stages of the processing sequence of FIG. 1 in accordance with some embodiments of the present invention.
Figure 3B:
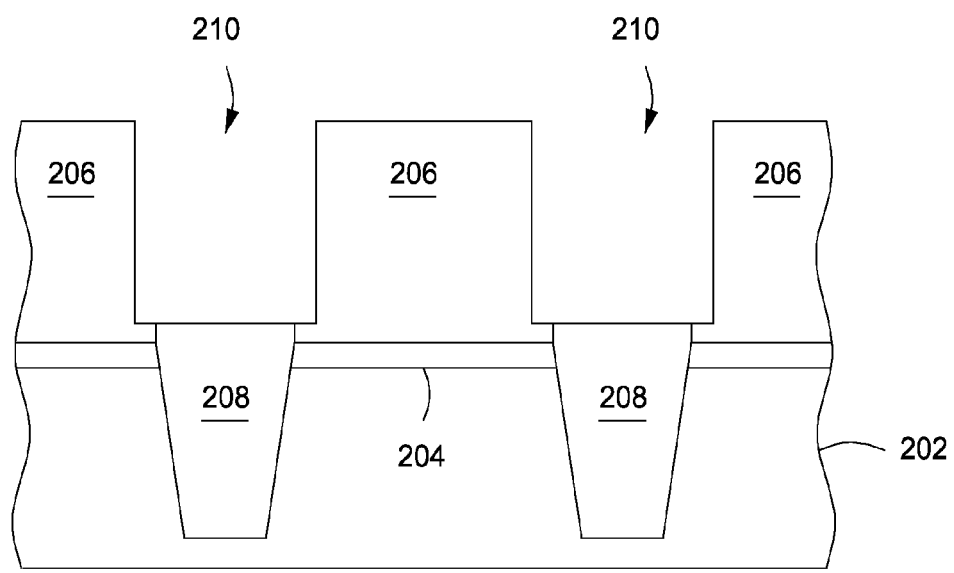

When performed, the preclean process removes the layer 302 from the substrate 202, such as shown in FIG. 3B. The preclean process may be performed in a manner similar to the process described above with respect to the formation of the layer. However, in place of the nitrogen containing gas and radicals and excited neutrals, a hydrogen containing gas and hydrogen radicals and excited neutrals may be utilized to facilitate the clean process. For example, in some embodiments, the hydrogen containing gas may comprise hydrogen gas ($H_2$), ammonia ($NH_3$), or the like and the radicals and excited neutrals may be formed from hydrogen gas ($H_2$), ammonia ($NH_3$), or the like.

Figure 4:
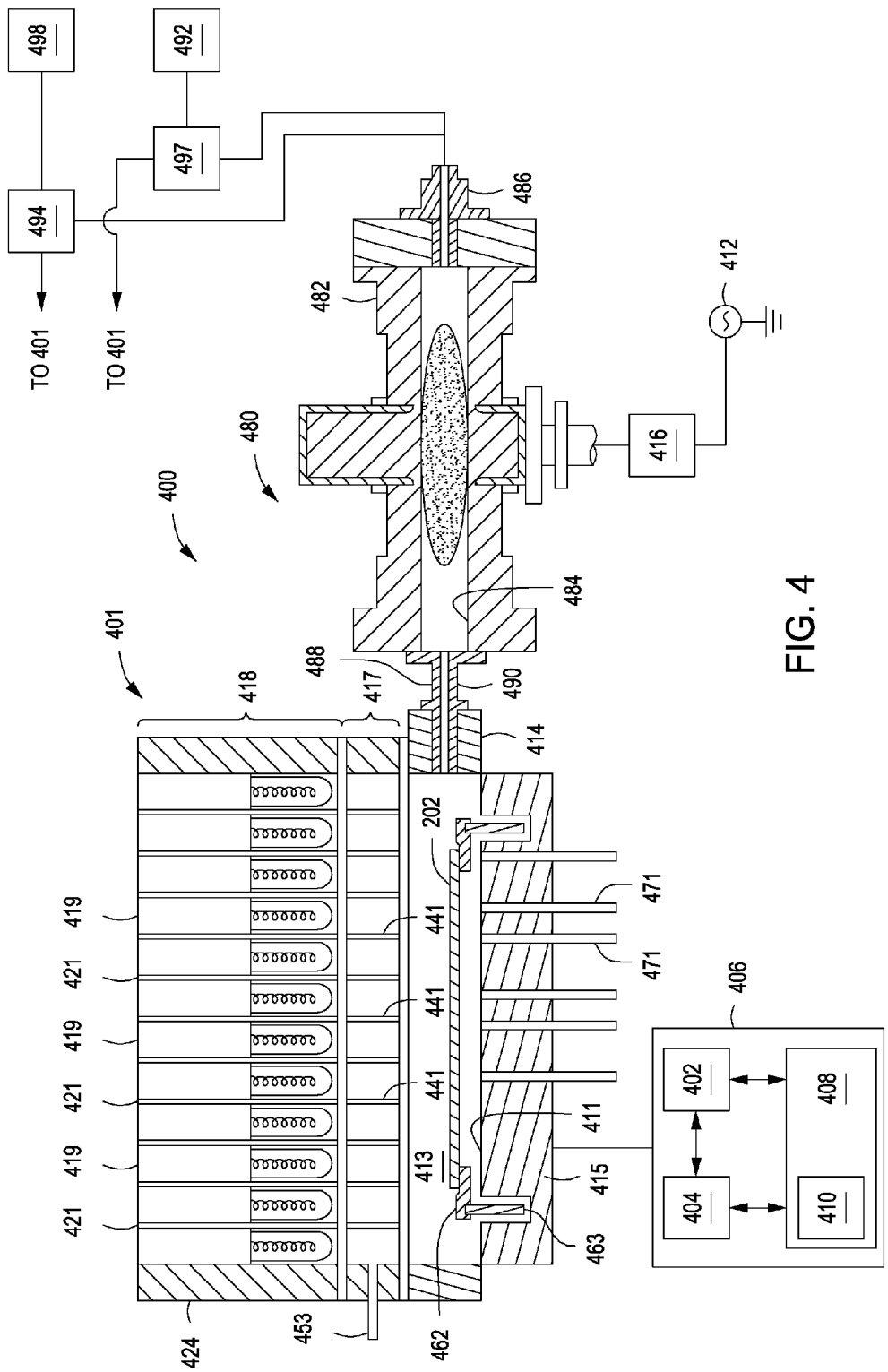
FIG. 4 depicts a processing system suitable for performing the method depicted in FIG. 1 in accordance with some embodiments of the present invention.

FIG. 4 depicts a processing system (system 400) suitable for performing the method depicted in FIG. 1 in accordance with some embodiments of the present invention. In some embodiments, the system 400 may generally include a process chamber 401 and a remote plasma source 480 coupled to the process chamber 401 to remotely provide a plasma to the process chamber 401. The system 400 may include a rapid thermal processing (RTP) chamber (e.g., process chamber 401), for example, such as Centura® RTP commercially available from Applied Materials, Inc., located in Santa Clara, Calif. Other types of thermal reactors may be substituted for the RTP apparatus such as, for example, RPN, RPO, Vantage RadiancePlus™ RTP, Vantage RadOX™ RTP, Radiance® RTP, or other similar process chambers/reactors available from Applied Materials Inc. of Santa Clara, Calif.

The process chamber 401 generally includes a processing region 413 defined by area between a side wall 414, a bottom 415 and a window assembly 417. In some embodiments, a light pipe assembly 418 (enclosed by an upper side wall 424) is positioned over and coupled to window assembly 417. A light pipe assembly 418 may be disposed above the window assembly 417 and may include a plurality of lamps 419 (e.g., halogen lamps, such as tungsten halogen lamps) each mounted into light pipes 421 and positioned to adequately cover an entire surface area of the substrate 202. In some embodiments, the window assembly 417 may include a plurality of light pipes 441 disposed beneath the light pipes 421. In some embodiments, a vacuum can be produced in the plurality of light pipes 441 by applying a vacuum to an exhaust 453 fluidly coupled to one of the light pipes 441 which is, in turn, fluidly coupled 506 to the rest of the pipes.

The substrate 202 is supported by a support ring 462 within the processing region 413 above a reflector plate 411. In some embodiments, the support ring 462 is mounted on a rotatable cylinder 463 to facilitate rotating the substrate 202. The reflector plate 411 reflects energy to a backside of the substrate 202 to facilitate uniform heating of the substrate 202. In some embodiments, a plurality of fiber optic probes 471 may be disposed through the bottom 415 and the reflector plate 411 to facilitate monitoring a temperature of the substrate 202.

The remote plasma source 480 generally includes a body 482 having an inlet 486 and an outlet 488 and a tube 484 (e.g., a quartz or sapphire tube) disposed within the body 482. A power source 412 (e.g., an RF power source) may be coupled to the remote plasma source 480 via a match network 416 to provide power to the remote plasma source 480 to facilitate forming the plasma. The outlet 488 is fluidly coupled to the process chamber 401 via a conduit 490 to facilitate delivery of the plasma from the remote plasma source 480 to the process chamber 401. In some embodiments, one or more gas sources (two gas sources 492, 498 shown) may be coupled to the remote plasma source 480 and/or process chamber 401. Each gas source 492, 498 may selectively provide a nitrogen containing gas (e.g., the nitrogen containing gases described above) to the remote plasma source 480 and/or process chamber 401 via a plurality of valves 494, 497.

A controller 406 may be coupled to various components of the system 400, such as at the process chamber 401 and/or the remote plasma source 480 to control the operation thereof. The controller 406 generally comprises a central processing unit (CPU) 404, a memory 408, and support circuits 402 for the CPU 404. The controller 406 may control the system 400 directly, or via other computers or controllers (not shown) associated with particular support system components. The controller 406 may be one of any form of general-purpose computer processor that can be used in an industrial setting for controlling various chambers and sub-processors. The memory, or computer-readable medium, 408 of the CPU 404 may be one or more of readily available memory such as random access memory (RAM), read only memory (ROM), floppy disk, hard disk, flash, or any other form of digital storage, local or remote. The support circuits 402 are coupled to the CPU 404 for supporting the processor in a conventional manner. These circuits include cache, power supplies, clock circuits, input/output circuitry and subsystems, and the like. Inventive methods as described herein may be stored in the memory 408 as software routine 410 that may be executed or invoked to turn the controller into a specific purpose controller to control the operation of the process chamber 300 in the manner described herein. The software routine may also be stored and/or executed by a second CPU (not shown) that is remotely located from the hardware being controlled by the CPU 404.

Referring to FIG. 5, in some embodiments, the conduit 490 may be coupled to a side (e.g., sidewall 414) of the process chamber 401 between the slit valve 514/gas inlet 530 that provides the process gas (e.g., as described above) and the exhaust 512 that evacuates the process chamber 401 and facilitates a laminar flow of process gas across the substrate 202. In some embodiments, the conduit 490 is coupled to a port 532 via an inlet 534. In such embodiments the port 532 may be disposed such that an edge 524 of the slit valve 514 may be disposed about 60 degrees from an edge 526 of the port 532.

Figure 6A:
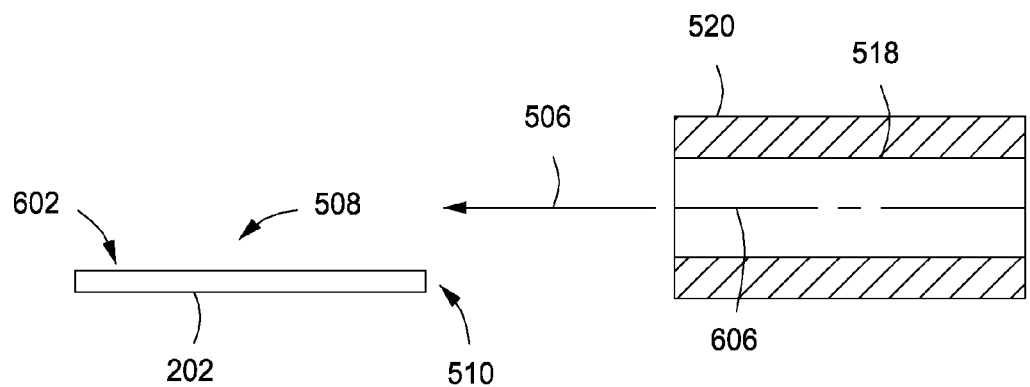
FIGS. 6A-B respectively depict partial cross sectional views of a portion of the processing system shown in FIG. 5 in accordance with some embodiments of the present invention.
Figure 6B:
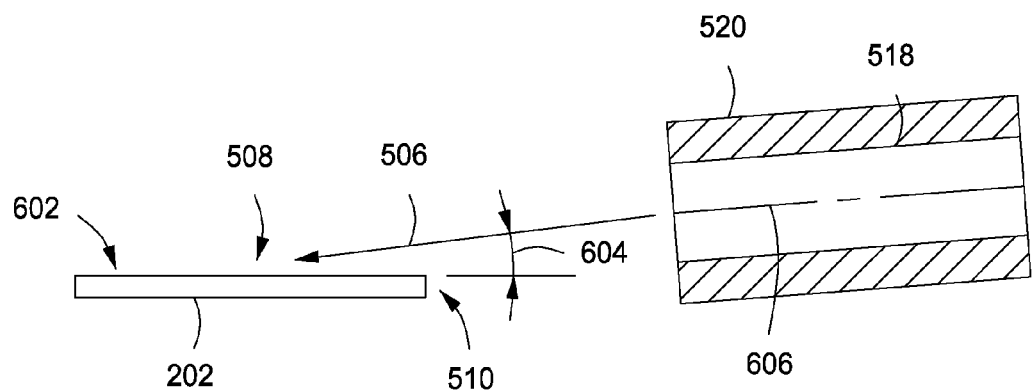

In some embodiments, an insert 520 having channel 518 formed through the insert 520 is disposed in the port 532. The insert 520 may be fabricated from any suitable process compatible material, for example, such as quartz. The channel 518 facilitates directional flow of a plasma (provided by the remote plasma source 480) within the process chamber 401, for example, such as described above. In some embodiments, the channel has a circular cross section, having a diameter of about 0.060 to about 0.600 inches, or in some embodiments about 0.57 inches, or in some embodiments, about 0.6 inches. The channel 518 may be formed having any angle suitable to provide the plasma in a desired direction. For example, in some embodiments, the channel as measured from a central axis 536 of the channel 518 to a central axis of the substrate 202 may be about −60 to about 60 degrees (in the x-y plane as shown in FIG. 5, or in some embodiments, about 19 degrees, or in some embodiments, 33.5 degrees. In addition, the channel 518 may facilitate a directional flow of plasma towards the top surface 602 of the substrate 202 such as shown in FIGS. 6A-B as described above. For example, in some embodiments, the channel 518 may be formed such that a central axis 606 of the channel 518 is substantially parallel to the top surface 602 of the substrate 202 such as shown in FIG. 6A. Alternatively, the channel 518 may be formed such that an angle 604 between the central axis 606 of the channel 518 and the top surface 602 of the substrate 202 is about −10 to about 10 degrees (with respect to the x-y plane), or in some embodiments, about 5 degrees.

Thus, embodiments of methods for forming a layer atop a substrate have been provided herein. In at least some embodiments, the inventive method may advantageously provide a method that allows for an improved control over a thickness and uniformity of a layer across a substrate as compared to conventionally utilized processes.

While the foregoing is directed to embodiments of the present invention, other and further embodiments of the invention may be devised without departing from the basic scope thereof.

The invention claimed is:

1. A method of forming a layer on a substrate, comprising:
providing a substrate to a substrate support in a process chamber, the process chamber having a gas port disposed on a first side of the substrate support, an exhaust disposed on a second side of the substrate support opposite the first side, and a plasma port disposed between the gas port and the exhaust;
providing a process gas from the gas port in a first direction such that the process gas flows across a surface of the substrate from the gas port to the exhaust;
providing a plasma from the plasma port to the substrate in a second direction that is different from the first direction to form a layer, wherein the plasma is provided such that a flow of the plasma interacts with a flow of the process gas at an angle that is non-perpendicular; and
rotating the substrate in a first direction while providing the process gas and the plasma, wherein a thickness profile of the layer is controlled by adjusting at least one of a flow velocity of the process gas, a flow velocity of the plasma, the angle the flow of the plasma interacts with the flow of the process gas, or a direction of rotation of the substrate.

2. The method of claim 1, further comprising:
exposing the plasma to the substrate for a period of time of about 30 to about 90 seconds to form the layer.

3. The method of claim 1, wherein the process chamber is maintained at a pressure of about 1 to about 20 Torr while forming the layer.

4. The method of claim 1, wherein the process gas is provided at a flow rate of about 1 to about 5 slm and the plasma is provided at a flow rate of about 1 to about 5 slm.

5. The method of claim 1, wherein the process chamber is maintained at a temperature of about 850 to about 1150 degrees Celsius while forming the layer.

6. The method of claim 1, wherein the flow of the plasma is substantially parallel to the surface of the substrate.

7. The method of claim 1, wherein the flow of the plasma is directed towards a top surface of the substrate.

8. The method of claim 7, wherein the thickness profile of the layer may be controlled by adjusting an angle between the flow of the plasma and the top surface of the substrate.

9. The method of claim 1, further comprising:
precleaning a surface of the substrate prior to forming the layer by exposing the substrate to a hydrogen containing plasma.

10. The method of claim 1, wherein the process gas comprises a nitrogen containing gas and the plasma is formed from a nitrogen containing gas, and wherein the layer is a nitrogen containing layer.

11. The method of claim 1, wherein the angle that the flow of the plasma interacts with the flow of the process gas is about 56 to about 71 degrees.

12. A method of forming a layer on a substrate, comprising:
providing a substrate to a substrate support in a process chamber, the process chamber having a gas port disposed on a first side of the substrate support, an exhaust disposed on a second side of the substrate support opposite the first side, and a plasma port disposed between the gas port and the exhaust;
providing a process gas from the gas port in a first direction such that the process gas flows across a surface of the substrate from the gas port to the exhaust, wherein the process gas comprises a nitrogen containing gas;
providing a plasma formed from a nitrogen containing gas from the plasma port to the substrate in a second direction that is different from the first direction to form a nitrogen containing layer, wherein the plasma is provided such that a flow of the plasma interacts with a flow of the process gas at an angle of about 56 to about 71 degrees; and
rotating the substrate in a first direction while providing the process gas and the plasma, wherein a thickness profile of the nitrogen containing layer is controlled by adjusting at least one of a flow velocity of the process gas, a flow velocity of the plasma, the angle the flow of the plasma interacts with the flow of the process gas, or a direction of rotation of the substrate.

13. A computer readable medium having instructions stored thereon that, when executed, cause a method of forming a layer on a substrate disposed on a substrate support in a process chamber having a gas port disposed on a first side of the substrate support, an exhaust disposed on a second side of the substrate support opposite the first side, and a plasma port disposed between the gas port and the exhaust to be performed, the method comprising:
providing a process gas from the gas port in a first direction such that the process gas flows across a surface of the substrate from the gas port to the exhaust;
providing a plasma from the plasma port to the substrate in a second direction that is different from the first direction to form a layer, wherein the plasma is provided such that a flow of the plasma interacts with a flow of the process gas at an angle that is non-perpendicular; and
rotating the substrate in a first direction while providing the process gas and the plasma, wherein a thickness profile of the layer is controlled by adjusting at least one of a flow velocity of the process gas, a flow velocity of the plasma, the angle the flow of the plasma interacts with the flow of the process gas, or a direction of rotation of the substrate.

14. The computer readable medium of claim 13, wherein the angle the flow of the plasma interacts with the flow of the process gas is about 56 to about 71 degrees.

15. The computer readable medium of claim 13, wherein the flow of the plasma is substantially parallel to the surface of the substrate, or wherein the flow of the plasma is directed towards a top surface of the substrate.

16. The computer readable medium of claim 13, further comprising:
precleaning a surface of the substrate prior to forming the layer by exposing the substrate to a hydrogen containing plasma.

17. The computer readable medium of claim 13, wherein the process gas comprises a nitrogen containing gas and the plasma is formed from a nitrogen containing gas, and wherein the layer is a nitrogen containing layer.

18. The computer readable medium of claim 13, wherein the process chamber is maintained at a pressure of about 1 to about 20 Torr and a temperature of about 850 to about 1150 degrees Celsius while forming the layer.

19. The computer readable medium of claim 13, further comprising:
exposing the plasma to the substrate for a period of time of about 30 to about 90 seconds to form the layer.

20. The computer readable medium of claim 13, wherein the process gas is provided at a flow rate of about 1 to about 5 slm and the plasma is provided at a flow rate of about 1 to about 5 slm.

* * * * *